United States Patent
Ishikawa et al.

(10) Patent No.: US 7,556,669 B2
(45) Date of Patent: Jul. 7, 2009

(54) AU-SN ALLOY POWDER FOR SOLDER PASTE

(75) Inventors: Masayuki Ishikawa, Sanda (JP); Masayoshi Kohinata, Sanda (JP); Akihumi Mishima, Sanda (JP)

(73) Assignee: Mitsubishi Materials Corporation, Tokyo (JP)

( * ) Notice: Subject to any disclaimer, the term of this patent is extended or adjusted under 35 U.S.C. 154(b) by 232 days.

(21) Appl. No.: 11/571,289

(22) PCT Filed: Jun. 27, 2005

(86) PCT No.: PCT/JP2005/011740

§ 371 (c)(1),
(2), (4) Date: Dec. 26, 2006

(87) PCT Pub. No.: WO2006/001422

PCT Pub. Date: Jan. 5, 2006

(65) Prior Publication Data

US 2007/0183922 A1  Aug. 9, 2007

(30) Foreign Application Priority Data

Jun. 28, 2004  (JP) .............................. 2004-189215

(51) Int. Cl.
*B22F 9/00* (2006.01)

(52) U.S. Cl. ........................................ 75/247; 148/430
(58) Field of Classification Search .... 75/247; B22F 9/08

See application file for complete search history.

(56) References Cited

FOREIGN PATENT DOCUMENTS

| DE | 4012197 | 10/1991 |
| JP | 53-45188 | 4/1978 |
| JP | 60-150639 A | 8/1985 |
| JP | 2003-105461 A | 4/2003 |
| JP | 2003105462 A * | 4/2003 |
| WO | WO-9116160 | 10/1991 |

* cited by examiner

*Primary Examiner*—George Wyszomierski
*Assistant Examiner*—Weiping Zhu
(74) *Attorney, Agent, or Firm*—Darby & Darby, P.C.

(57) ABSTRACT

The problem is to provide an Au—Sn alloy powder for use in producing an Au—Sn alloy solder paste having reduced generation of voids. The problem is solved by an Au—Sn alloy powder for a solder paste, which has a composition consisting of Sn of 20.5-23.5% by mass and a remainder containing Au and inevitable impurities, and which has a microstructure in which 0.5 to 30 area % of fine Sn-rich primary crystal phase regions having a diameter of 3 μm or less are crystallized in a matrix.

1 Claim, No Drawings

US 7,556,669 B2

AU-SN ALLOY POWDER FOR SOLDER PASTE

CROSS-REFERENCE TO PRIOR APPLICATIONS

This is a U.S. national phase application under 35 U.S.C. §371 of International Patent Application No. PCT/JP2005/011740 filed Jun. 27, 2005, and claims the benefit of Japanese Application No. 2004-189215, filed Jun. 28, 2004. The International Application was published in Japanese on Jan. 5, 2006 as International Publication No. WO 2006/001422 under PCT Article 21(2).

TECHNICAL FIELD

The present invention relates to an Au—Sn alloy powder for producing an Au—Sn alloy solder paste having reduced generation of voids. More particularly, the present invention is related to an Au—Sn alloy powder for use in producing an Au—Sn alloy solder paste which has no generation of voids having a diameter of more than 25 μm. Further, the present invention is also related a solder paste containing the Au—Sn alloy powder of the present invention, which is especially advantageous for soldering an Au-coated plate.

BACKGROUND ART

Conventionally, it is known that Au—Sn alloy solder pastes are used for bonding semiconductor devices (e.g., GaAs device, high frequency GaAs device, heat transfer device, or the like) to substrates, or used for package sealing of SAW filters, crystal radiators or the like, which requires extreme fineness and air-tightness. It is also known that an Au—Sn alloy powder contained in an Au—Sn alloy solder paste is a eutectic alloy polymer having a composition consisting of Sn of 20% by mass and a remainder containing Au and inevitable impurities, and that such an Au—Sn alloy powder can be obtained by gas atomization.

In recent years, minimization of package size has rapidly progressed. Specifically, a package to be sealed has been minimized to a size of 1.6 mm (length)×1.0 mm (width), and it is attempted to further minimize the size. With respect to the frame of the lid-bonding portion provided in a package having a size of 1.6 mm (length)×1.0 mm (width), the width thereof is as small as from 100 to 250 μm, and sealing of the package is performed by applying the above-mentioned Au—Sn alloy solder paste to this narrow frame, followed by placing a lid thereon and heating. As the minimization of package size progresses, the width of the frame becomes increasingly smaller. In the case where package sealing of a SAW filter, a crystal radiator or the like (which requires a high level of air-tightness) is performed by soldering on such a narrow frame, when a large amount of voids are generated at the soldering portion, air-tightness gets lowered, thereby leading to lowering of soldering reliability. Especially, generation of large voids having a diameter of more than 25 μm is one of the main reasons for the lowering of air-tightness in small packages.

For solving this problem, there has been provided an Au—Sn alloy solder paste by using an Au—Sn alloy powder having a composition consisting of Sn of 15-25% by mass and a remainder containing Au and inevitable impurities, in which the surface of the Au—Sn alloy powder has a composition consisting of Sn of 7-12% by mass and a remainder containing Au and inevitable impurities, and has Au-rich primary crystal phase regions of 10 area% or more crystallized. This Au—Sn alloy powder which has Au-rich primary crystal phase regions of 10 area% or more crystallized in the surface is obtained by gas atomizing a molten Au—Sn alloy under conditions in which the molten Au—Sn alloy is maintained at a temperature lower than a typical molten temperature (i.e., 300° C. to lower than 600° C.), the molten metal pressurizing pressure and the injection pressure are respectively maintained at 20 kPa to lower than 300 kPa and 500 kPa to lower than 5,000 kPa (which are lower than typical pressure conditions), and the nozzle diameter is 0.3 mm to less than 2 mm. In the surface portion of the thus obtained Au—Sn alloy powder, the proportion of Au-rich primary crystal phase regions crystallized is large as compared to the composition of the entire Au—Sn alloy powder. Therefore, this Au—Sn alloy powder is advantageous in that the amount of surface oxidation becomes small, in that the surface is not easily flawed during classification by sieving, and in that a paste containing this Au—Sn alloy powder has small generation of voids, thereby rendering it possible to achieve a good bonding (see 1: Japanese Unexamined Patent Application, First Publication No 2003-105462 ("JP '462").

SUMMARY OF THE INVENTION

However, when a paste containing the above-mentioned Au—Sn alloy powder described in JP '462 is used for soldering, although the number of voids generated is decreased, generation of large voids having a diameter of more than 25 μm is observed, so that reliable sealing of small size packages cannot be performed. Therefore, there has been desired a paste containing an Au—Sn alloy powder which has a small generation of large voids having a diameter of more than 25 μm, as well as an even more decreased number of voids generated.

In this situation, the present inventors made studies to obtain an Au—Sn alloy paste which has a small generation of large voids having a diameter of more than 25 μm, as well as an even more decreased number of voids generated. As a result, it has been found:

(a) that, with respect to a solder paste obtained by mixing in a flux an Au—Sn alloy powder which has a composition consisting of Sn of 20.5-23.5% by mass and a remainder containing Au and inevitable impurities, and which has a microstructure in which fine Sn-rich primary crystal phase regions having a diameter of 3 μm or less are crystallized in a matrix, when the solder paste is used for soldering, the soldering portion has no generation of large voids having a diameter of more than 25 μm, and the number of voids generated is much smaller than the conventional Au—Sn alloy solder pastes; and (b) that, however, even in the case of this Au—Sn alloy powder which has fine Sn-rich primary crystal phase regions having a diameter of 3 μm or less crystallized, it is necessary that the amount of Sn-rich primary crystal phase regions crystallized be within the range of from 0.5 to 30 area%, and that the Au—Sn alloy powder has a microstructure in which there is no crystallized Au- rich primary crystal phase region.

Based on these findings, the present invention has been completed. Specifically, the present invention is related to:

(1) an Au—Sn alloy powder for a solder paste, which has a composition consisting of Sn of 20.5-23.5% by mass and a remainder containing Au and inevitable impurities, and which has 0.5 to 30 area % of fine Sn-rich primary crystal phase regions having a diameter of 3 μm or less crystallized in a matrix; and (2) a solder paste comprising the Au—Sn alloy powder of item (1) above and a flux, the flux comprising rosin, an activator, a solvent and a viscosity improver.

The Au—Sn alloy powder of the present invention for a solder paste (which has 0.5 to 30 area % of fine Sn-rich primary crystal phase regions having a diameter of 3 μm or less crystallized) is produced by melting an Au—Sn alloy having a composition consisting of Sn of 20.5-23.5% by mass and a remainder containing Au and inevitable impurities to thereby obtain a molten metal, subjecting the molten metal to mechanical stirring while maintaining the temperature of the molten metal at 600 to 1,000° C., and injecting the molten metal during or after the mechanical stirring with an inert gas through a small nozzle having a diameter of 1-2 mm and provided with a nozzle gap of 0.3 mm or less, under conditions in which the molten metal is pressurized at 300-800 kPa and the injection pressure is 5,000-8,000 kPa. The stirring is preferably mechanical stirring, and more preferably screw stirring. Further, electric stirring, such as electromagnetic stirring can be used in combination with mechanical stirring, and in the present invention, stirring includes such a combination of mechanical stirring and electric stirring. With respect to the revolution rate of the mechanical stirring, there is no particular limitation. However, it is preferred to perform screw stirring at a revolution rate of 60-100 rpm for 3-10 minutes.

In the production of the Au—Sn alloy powder of the present invention for a solder paste, by subjecting the molten Au—Sn alloy to mechanical stirring, there is no grow of the Sn-rich primary crystal phase regions, and a molten Au—Sn alloy having no cluster of Au-rich primary crystal phase regions can be obtained. Further, by atomizing the thus obtained molten Au—Sn alloy, there can be obtained an Au—Sn alloy powder which has no Au-rich primary phase region and has 0.5 to 30 area % of fine Sn-rich primary crystal phase regions having a diameter of 3 μm or less crystallized in a matrix. When a paste comprising the above-mentioned Au—Sn alloy powder and a flux comprised of rosin, an activator, a solvent and a viscosity improver is used for soldering, the number of voids generated at the soldering portion decreases, and, especially, no generation of large voids having a diameter of more than 25 μm is observed.

Conventionally, there has been known a method in which an Au—Sn alloy having a composition consisting of Sn content is 20.5-23.5% by mass and a remainder containing Au and inevitable impurities is melted to obtain a molten metal, and the obtained molten metal is subjected to inert gas atomization, thereby obtaining an Au—Sn alloy powder. However, with respect to such an Au—Sn alloy powder obtained by gas atomizing a molten Au—Sn alloy having a composition consisting of Sn of 20.5-23.5% by mass and a remainder containing Au and inevitable impurities without mechanical stirring, even when fine Sn-rich primary crystal phase regions having a diameter of 3 μm or less are crystallized, the amount of the Sn-rich primary crystal phase regions does not exceed 0.4 area %, and the majority of the Sn-rich primary crystal phase regions crystallized in the surface has a diameter as large as more than 3 μm. When such Sn-rich primary crystal phase regions having a diameter of more than 3 μm are crystallized, not only does the number of voids generated increases, but also large voids having a diameter of more than 25 μm are generated.

The Au—Sn alloy powder of the present invention for a solder paste, which has 0.5 to 30 area % of fine Sn-rich primary crystal phase regions having a diameter of 3 μm or less crystallized and has no Au-rich primary phase region can be produced by stirring a molten Au—Sn alloy having a composition consisting of Sn of 20.5-23.5% by mass and a remainder containing Au and inevitable impurities, followed by atomizing.

In the present invention, the reason for limiting the Sn content of the Au—Sn alloy powder for a solder paste within the range of 20.5 to 23.5% by mass is as follows. This type of solder paste is generally used for soldering on an Au-coated substrate. In such a case, when the Sn content of the Au—Sn alloy powder is less than 20.5% by mass, Au in the Au coating corrodes the solder metal (i.e., Au—Sn alloy), so that the Au concentration increases. Due to the increase in the Au concentration, Au-rich primary crystal phase regions crystallize in the contacting interface of the melted Au—Sn alloy, so that the melting point of the solder paste becomes high and the viscosity of the molten liquid becomes high, thereby causing a disadvantage in that the gas generated during the melting of the paste gets trapped near the substrate. On the other hand, when the Sn content exceeds 23.5% by mass, disadvantages are caused in that Sn-rich primary crystal phase regions having a diameter as large as more than 3 μm crystallize even after the mechanical stirring of the molten metal, and in that the total amount of crystallized Sn-rich primary crystal phase regions exceeds 30 area %.

Further, in the Au—Sn alloy powder of the present invention for a solder paste, the Sn-rich primary crystal phase regions which crystallize in a cross-section has a composition consisting of Sn content of 37 to 39% by mass and a remainder containing Au and inevitable impurities. The reason for this is that in a molten metal having a composition consisting of Sn of 20.5 to 23.5% by mass and a remainder containing Au and inevitable impurities, the Sn-rich primary crystal phase regions which crystallize inevitably have an Sn content of 37 to 39% by mass.

In the present invention, the reason the amount of fine Sn-rich primary crystal phase regions having a diameter of 3 μm or less crystallized in the Au—Sn alloy powder is limited within the range of from 0.5 to 30 area % is as follows. When the amount of the fine Sn-rich primary crystal phase regions is less than 0.5 area %, Au in the substrate which is generally coated with Au corrodes the Au—Sn alloy, so that the Au-rich primary crystal phase regions crystallize in the contacting interface of the melted Au—Sn alloy. These Au-rich primary crystal phase regions exhibit a high melting point as compared to other eutectic constituents, so that the viscosity of a molten liquid of these Au-rich primary crystal phase regions becomes higher than molten liquids of other eutectic constituents at the same temperature, thereby causing a disadvantage in that the gas generated during the melting of the paste gets trapped near the substrate. On the other hand, when the amount of fine Sn-rich primary crystal phase regions exceeds 30 area %, the melting point of the alloy powder apparently shifts to high temperature, so that the proportion of the Sn-rich primary crystal phase regions becomes high. Further, by shifting from the eutectic point, the melting point becomes high, so that the viscosity of the molten liquid becomes high, thereby causing a disadvantage in that the gas generated during the melting of the paste becomes susceptible to trapping. In the present invention, the amount of the Sn-rich primary crystal phase regions crystallized in a cross-section of the Au—Sn alloy powder is in the range of from 10 to 20 area %.

A solder paste containing the Au—Sn alloy powder of the present invention has no generation of large voids having a diameter of more than 25 μm. Therefore, the Au—Sn alloy powder of the present invention exhibits excellent industrial effects in that it can provide a solder paste having excellent reliability as compared to a solder paste containing a conventional Au—Sn alloy powder, and in that it can reduce the occurrence of defects in a semiconductor device.

DETAILED DESCRIPTION OF THE INVENTION

Au—Sn alloy powders 1 to 5 of the present invention, Comparative Au—Sn alloy powders 1 to 5 and Conventional Au—Sn alloy powders 1 and 2 were produced as follows. An Au—Sn alloy having a composition as indicated in Table 1 was melted in a high frequency melting furnace to obtain a molten metal. The molten metal was subjected to mechanical stirring by rotating a screw for a period of time as indicated in Table 1, while maintaining the molten metal at a temperature as indicated in Table 1. During or after the mechanical stirring, the molten metal was pressurized at a pressure as indicated in Table 1, to thereby allow the molten metal to drop from a nozzle provided at the bottom of the high frequency melting furnace. Simultaneously with the dropping of the molten metal, Ar gas was injected toward the dropping molten metal at an injection pressure as indicated in Table 1 through a gas nozzle having a diameter as indicated in Table 1 and provided with a 0.2 mm nozzle gap on the periphery thereof, thereby obtaining a gas atomized powder. The obtained gas atomized powder was sieved to thereby obtain an Au—Sn alloy powder.

Each of the Au—Sn alloy powders 1 to 5 of the present invention, Comparative Au—Sn alloy powders 1 to 5 and Conventional Au—Sn alloy powders 1 and 2 was filled in a resin and subjected to cross-section polishing. Then, the polished cross-section was subjected to EPMA (electron probe microanalysis) to obtain an EPMA image. From the EPMA image, 10 samples of powder particles having a cross-sectional diameter of 15 μm were selected, and with respect to each of the 10 samples, the particle diameter of the Sn-rich primary crystal phase regions and the amount of the Sn-rich primary crystal phase regions in terms of percentage of the cross-sectional area of the sample (area %) were measured by an image processing software. The results are shown in Table 2.

Each of the Au—Sn alloy powders 1 to 5 of the present invention, Comparative Au—Sn alloy powders 1 to 5 and Conventional Au—Sn alloy powders 1 and 2 was mixed with a typical RMA flux at a flux ratio of 7% by mass, thereby obtaining a solder paste.

Subsequently, using the obtained solder paste, the following measurements were performed.

Firstly, an Fe—Ni alloy plate (Ni: 42%; remainder: Fe and inevitable impurity) having a size of 10 mm (length)×10 mm (width)×1 mm (thickness) was prepared. An Ni coating having a thickness of 2.5 μm was applied to the Fe—Ni alloy plate, and then, an Au coating having a thickness of 0.03 μm was further applied, thereby obtaining a substrate.

To the substrate was printed the above-obtained solder paste using a mask having a diameter of 6.5 μm and a thickness of 1.2 mm, followed by reflowing (preheating: 150° C./60 seconds+main heating: 320° C./60 seconds). Then, generated voids having various sizes as indicated in Table 2 were observed by a transmission X ray apparatus, and the number of voids was counted using an image processing software. The results are shown in Table 2.

TABLE 1

Production conditions of Au—Sn alloy powder

| Au—Sn alloy powder | | Composition (% by mass) | | Melting conditions | | | Atomization conditions | | |
|---|---|---|---|---|---|---|---|---|---|
| | | | | Temperature at which molten Au—Sn alloy is maintained (° C.) | Screw stirring conditions | | Molten metal pressurizing pressure (kPa) | Injection Pressure (kPa) | Nozzle diameter (mm) |
| | | Sn | Au and inevitable impurities | | Number of screw revolutions (rpm) | Screw revolution time (minute) | | | |
| Present invention | 1 | 20.5 | Remainder | 800 | 80 | 3 | 500 | 6,000 | 1.5 |
| | 2 | 21 | Remainder | 800 | 80 | 3 | 500 | 6,000 | 1.5 |
| | 3 | 22 | Remainder | 800 | 80 | 3 | 500 | 6,000 | 1.5 |
| | 4 | 23 | Remainder | 800 | 80 | 3 | 500 | 6,000 | 1.5 |
| | 5 | 23.5 | Remainder | 800 | 80 | 3 | 500 | 6,000 | 1.5 |
| Comparative | 1 | 18* | Remainder | 800 | 80 | 3 | 500 | 6,000 | 1.5 |
| | 2 | 19* | Remainder | 800 | 80 | 3 | 500 | 6,000 | 1.5 |
| | 3 | 22 | Remainder | 800 | —* | —* | 500 | 6,000 | 1.5 |
| | 4 | 20* | Remainder | 800 | 80 | 3 | 500 | 6,000 | 1.5 |
| | 5 | 24.0* | Remainder | 800 | 80 | 3 | 500 | 6,000 | 1.5 |
| Conventional | 1 | 20 | Remainder | 800 | — | — | 500 | 6,000 | 3 |
| | 2 | 20 | Remainder | 400 | — | — | 100 | 100 | 1 |

*indicates that the value is outside the range of the present invention.

TABLE 2

| Au—Sn alloy powder | | Sn-rich primary crystal phase regions in cross-section of Au—Sn alloy powder | | Number of voids of respective sizes after reflowing | | | |
|---|---|---|---|---|---|---|---|
| | | Amount of generated Sn-rich primary crystal phase regions having a diameter of 3 μm or less (area %) | Amount of generated Sn-rich primary crystal phase regions having a diameter of more than 3 μm (area %) | <15 μm | 15-20 μm | more than 20-25 μm | >25 μm |
| Present Invention | 1 | 0.5 | 0 | 25 | 10 | 1 | 0 |
| | 2 | 6 | 0 | 28 | 12 | 1 | 0 |
| | 3 | 16 | 0 | 33 | 16 | 1 | 0 |
| | 4 | 22 | 0 | 50 | 23 | 2 | 0 |
| | 5 | 28 | 0 | 68 | 30 | 2 | 0 |
| Comparative | 1 | 0* | 0 | 270 | 150 | 273 | 64 |
| | 2 | 0* | 0 | 221 | 141 | 54 | 12 |
| | 3 | 0.4* | 15.6* | 115 | 55 | 28 | 3 |
| | 4 | 0.2* | 0 | 140 | 95 | 44 | 5 |
| | 5 | 26 | 10* | 218 | 156 | 73 | 15 |
| Conventional | 1 | 0 | 0 | 144 | 105 | 46 | 3 |
| | 2 | 55.1 area % of Au-rich primary crystal phase regions crystallizes | | 340 | 200 | 95 | 32 |

*indicates that the value is outside the range of the present invention.

From the results shown in Table 1 and 2 above, it can be seen that the solder pastes containing Au—Sn alloy powders 1 to 5 of the present invention have a small number of voids generated, as compared to the solder pastes containing Conventional Au—Sn alloy powders 1 and 2, and that the solder pastes containing Conventional Au—Sn alloy powders 1 and 2 have generation of large voids having a diameter of more than 25 μm, whereas the solder pastes containing Au—Sn alloy powders 1 to 5 of the present invention have no generation of voids having a diameter of more than 25 μm. Further, it can be seen that Comparative Au—Sn alloy powders 1 to 5 which are outside the scope of the present invention have an unfavorable increase in the number of voids generated.

The invention claimed is:

1. An Au—Sn alloy powder for a solder paste, which has a composition consisting of Sn of 20.5-23.5% by mass and a remainder containing Au and inevitable impurities, and which has a microstructure in which 0.5 to 30 area % of fine Sn-rich primary crystal phase regions having a diameter of 3 μm or less are crystallized in a matrix, and further which has no Au-rich primary crystal phase regions.

\* \* \* \* \*